United States Patent [19]

Miyake

[11] Patent Number: 4,743,325

[45] Date of Patent: May 10, 1988

[54] METHOD OF STICKING FILM SHEET ON PANEL SURFACE

[75] Inventor: Eiichi Miyake, Osaka, Japan

[73] Assignees: Hakuto Co., Ltd., Tokyo; Sanei Giken Co., Ltd., Osaka, both of Japan

[21] Appl. No.: 908,233

[22] Filed: Sep. 17, 1986

Related U.S. Application Data

[62] Division of Ser. No. 607,114, May 1, 1984, Pat. No. 4,659,419.

[30] Foreign Application Priority Data

May 11, 1983 [JP] Japan .................................. 58-82241
Oct. 3, 1983 [JP] Japan .................................. 58-184659

[51] Int. Cl.⁴ ........................ B32B 31/18; B32B 31/20
[52] U.S. Cl. .................................... 156/250; 156/510; 156/521; 156/522; 156/552; 156/555
[58] Field of Search ............... 156/250, 510, 521, 522, 156/552, 555

[56] References Cited

U.S. PATENT DOCUMENTS

| | | | |
|---|---|---|---|
| 2,721,669 | 10/1955 | Keely | 156/522 |
| 2,721,670 | 10/1955 | Shenigo | 156/522 |
| 2,732,880 | 1/1956 | Hawk | 156/522 |
| 2,783,839 | 3/1957 | Rugg | 164/34 |
| 3,421,963 | 1/1969 | La Bombard | 156/355 |
| 3,438,835 | 4/1969 | Chen | 156/522 |
| 3,577,297 | 5/1971 | Howard | 156/265 |
| 3,658,629 | 4/1972 | Cramer et al. | 156/552 |
| 3,886,033 | 5/1975 | MacDonald | 156/522 |
| 4,025,380 | 5/1977 | Bernardo | 156/522 |
| 4,274,903 | 6/1981 | Mock | 156/355 |
| 4,491,492 | 1/1985 | Hetherington | 156/521 |
| 4,585,509 | 4/1986 | Obayashi | 156/522 |

FOREIGN PATENT DOCUMENTS 0085793 12/1984 European Pat. Off. .

*Primary Examiner*—Caleb Weston
*Attorney, Agent, or Firm*—Wenderoth, Lind & Ponack

[57] ABSTRACT

A method of sticking film sheet on a panel surface is disclosed in which a continuous web of film is cut to proper length fitted to the size of the panel to make an individual film sheet during continuous sticking operation for producing a film laminated panel. The sticking operation is not interrupted by the cutting operation.

A laminator constructed to achieve this film laminated panel manufacture includes block members which are movable toward and away from the tacking station where the leading end of the continuous web of film is tacked to the forward end of the panel, and a cutter mounted on the block members. The cutter severs across the film web as the block members moves toward the tacking station in the same direction and at the same speed as the film web during sticking operation.

1 Claim, 5 Drawing Sheets

METHOD OF STICKING FILM SHEET ON PANEL SURFACE

This application is a division of application Ser. No. 607,114, filed May 1, 1984, now U.S. Pat. No. 4,659,419.

BACKGROUND OF THE INVENTION

1. Field of the Invention

The present invention relates to a method of sticking film sheet on a panel surface and a laminator designed for this sticking operation.

2. Description of the Prior Art

There have been known in the prior art laminators used to stick film such as photosensitive dry film to the surfaces of the panels which are made of, for example, copper laminated glass epoxy board. In these laminators the film is pressure stuck in continuous film web form to the plurality of panels in turn, the panels being carried on a transfer means such as a roller conveyor. At the subsequent stage the panels thus jointed with the length of film web are separated into individual sheet film laminated panels by severing the film web at the points where each panel is connected thereby to the adjacent ones. However, these conventional procedures not only have demanded a great deal of time and labor in the finishing stage but also have caused a quantity of severed film to be wasted.

An improved laminator has been proposed to overcome the above-mentioned problems, as is described in Japanese Laid-Open Patent Application No. 52-14876. In this laminator a tacking means is provided to tack the leading end of the continuous web of film to the forward end of the blank panel which has carried over on the belt conveyor to the tacking station. The panel is then moved on the conveyor to pass together with the film web tacked thereon between a pair of pressure rolls adapted to pressure stick the film web on the surface of the panel. The operation of the belt conveyor and the pressure rolls are stopped when the panel moves a predetermined distance between the rolls. Then, the cutter severs across the film web to form a film sheet of predetermined length. The belt conveyor and the rolls are then restarted to complete pressure sticking of the separated film sheet on the panel surface. The severed end of the film web is tacked to the next panel and the same process is repeated. In this way, the individual film sheets are always cut from the continuous film web to just the required length matching the size of the panel and, accordingly, the extra finishing operation of trimming the film sheet on the panel involved in the prior art laminators is eliminated. Moreover, no waste of film as a result of cutting takes place.

However, this improved laminator presents a problem in the step of sticking the film sheet to the panel in itself. That is, as a result of temporary suspension of the sticking process while the film sheet is cut off from the film web, a linear roll mark tends to appear across the film sheet on the panel where the rolling operation has been stopped midway. This disadvantage prevents the production of film sheet laminated panels with uniform high quality.

SUMMARY OF THE INVENTION

It is therefore a general object of the present invention to provide a method of sticking film sheet to panels for the production of uniform high quality film sheet laminated panels free from additional finishing operations and without causing any wastage of film. Another object is to provide a laminator designed to achieve the above method.

According to the present invention, the steps of the method comprise transferring the blank panel to the film web tracking station of the laminator, tacking the leading end of the continuous film web to the forward end of the blank panel at the tacking station, sticking the film web on the panel surface with a single uninterrupted operation, and cutting the film web to form a film sheet of predetermined length matching the size of the panel. The method of this invention is characterized by severance of the continuous film web without causing a temporary suspension in the pressure sticking of film on the panel surface.

The cutting across the continuous film web may be effected by sliding a cutter across the film web while the cutter is moved in the same direction and at the same speed as the film web.

The laminator constructed in accordance with the present invention for sticking a film sheet cut from a continuous film web to a panel surface, comprises a laminator main body, and a conveyor means adapted to carry the panels through the laminator main body. The laminator main body comprises support frames, block members mounted on the support frames extending along the longitudinal length of the film web toward and away from a tacking station of the laminator, a tacking means mounted on the block members for reciprocatory movement toward and away from the panel placed at the tacking station, the tacking means having a guide surface for the film web and being designed to attach by suction the film web to the guide surface and also being designed to tack the leading end of the film web to the forward end of the panel, a cutter mounted on the block members for movement in the direction perpendicular to the direction of movement of the block members so as to cut across the continuous film web in order to form an individual film sheet, and a pair of pressure rolls vertically arranged and provided to compression stick therebetween the film sheet on the surface of the panel.

In the film sticking process of the laminator disclosed in Japanese Laid-Open Patent Application No. 52-14876, the pressure rolls have to temporarily stop midway in the operation of sticking the film on the panel surface while the film sheet of proper length is cut off from the continuous film web. According to the present invention, the sticking of film on the panel surface is completed in a single operation without interrupting the rolling of the pressure rolls, and the film web is cut to a film sheet of proper length by the lateral cutting motion of the cutter during sticking operation, with the resultant production of a film sheet laminated panel free from the irregularity on the film surface, which would be produced by the temporary interruption of the pressure rolls, as occurs in the aforesaid prior art laminator.

The pressure sticking technique employed to stick film sheet to a panel according to the present invention may be thermocompression bonding, cold compression cohesion, bonding with adhesives, or any other form of sticking. Moreover, the panel on which film sheet is stuck may be copper laminated glass epoxy board, iron plate, plastic plate, or paper board depending on the purpose for which the sticking technique is employed. In addition, the film used for sticking on the panel surface may be photosensitive film, masking film, or any other coating film.

DESCRIPTION OF THE PREFERRED EMBODIMENTS

Figure 1:
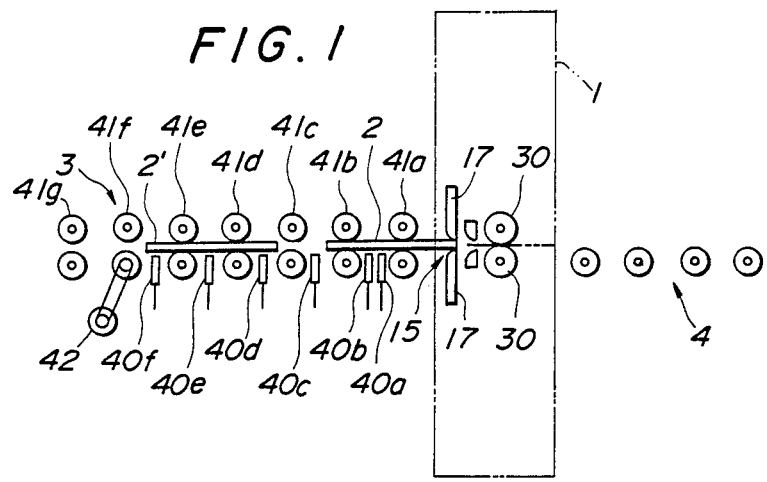
FIG. 1 is a schematic side view of a laminator constructed in accordance with a first preferred embodiment of the present invention.

Referring first to FIG. 1 illustrating a laminator according to the present invention, the laminator comprises a main body 1 and a conveyor means provided for transferring panels 2 one by one toward and away from the laminator main body 1. The conveyor means includes a first roller conveyor assembly 3 situated on the entrance side of the laminator main body 1 and a second roller conveyor assembly 4 situated on the exit side. Since the panel 2 is normally laminated with film on both sides, the laminator main body 1 is built symmetrically with respect to the axis of conveyance of the conveyor means. For the sake of brevity of illustration, the description hereinafter is confined to the upper half portion of the structure.

FIGS. 2 through 5 show detailed views of the structure of the laminator main body 1. The laminator main body 1 has plate-like support frames 5 (of which one is shown). Between the support frames 5 are rotatably mounted a film supply roll 7 and a take-up roll 9. The supply roll 7 carries a continuous film web 6 wound round its circumference. The film web 6 on the supply roll 7 is laminated with a protective material 8, which is stripped from the film web 6 and taken up by the take-up roll 9 when the film web 6 is unwound from the supply roll 7. A guide rail 10 is fixedly secured to the inner surface of each support frame 5. A plate-like block member 11 is slidably carried in each guide rail 10 for vertical movement relative thereto. Each of the block members 11 is linked by means of a connecting member 14 to drive chain 13 that is passed round the periphery of sprockets 12 positioned on the inner surface of each support frame 5. It is so arranged that the operation of the drive chain 13 causes the block member 11 to perform reciprocatory movement toward and away from a tacking station 15 (FIGS. 3 and 4) at which the continuous film web 6 is tacked to the panel 2.

Each of the block members 11 is formed at its lower end with a cam cutout 16. A tacking means 17 is movably mounted between the support frames 5 for movement along the path determined by the cam cutouts 16. The tacking means 17 is connected at either end to a piston-cylinder system 18 secured to each of the block members 11 for back and forth movement by operation of the piston-cylinder systems 18. In addition, the tacking means 17 is provided at either end with a rack 19 that extends vertically adjacent to the block member 11.

A pinion shaft 20 extending between and supported by the block members 11 carries at either end a pinion 21 for rotation in mesh engagement with the rack 19. With this arrangement, when both piston-cylinder systems 18 are operated simultaneously to drive the tacking means 17, the movement of the tacking means 17 is properly guided by the effect of synchronization of the racks 19 with the pinions 21 at the ends of the pinion shaft 20, without tilting to either side. The pinion shaft 20 is provided also to act as a pivot shaft for the tacking means 17 when the tacking means 17 moves along the cam cutouts 16 on both sides. In this way, the piston-cylinder systems 18 actuate the tacking means 17 to move toward and away from the panel 2 that is carried onto the tacking station 15.

The tacking means 17 is so designed that it not only guides the continuous film web 6 but also tacks the web 6 to the panel 2 while holding the web 6 against itself by suction force in the manner to be described later. The tacking means 17 is provided at its guide surface with vacuum holes 22 (FIG. 2 only) in rows. The vacuum holes 22 are connected to a vacuum source (not shown). A suitable vacuum control system (not shown) is provided in the vacuum line interconnected between the vacuum holes 22 and the vacuum source for controlled vacuum supply to the particular rows of vacuum holes 22 so as to accommodate a variety of widths of film web.

Each of the block members 11 is provided at its lower end with a bracket 23. Between the brackets 23 on both sides extend a guide bar 24 and a rack 25 supported substantially parallel to each other. A cutter holder 26 is slidably mounted on the guide bar 24 for movement thereon and has a cutter 27 in the form of a circular rotary blade. A motor (not shown) is provided mounted in the cutter holder 26 and is connected to the rotary cutter 27 for rotation thereof. This motor also carries a pinion (not shown) on its shaft which is engaged in mesh with the rack 25. The operation of the motor causes the cutter 27 to rotate and the cutter holder 26 to move along the guide bar 24 by means of interengagement between the rack 25 and the pinion. In this way, the film web 6 is cut across. Separate motors may be provided to respectively shift the cutter holder 26 along the guide bar 24 and rotate the cutter 27. The lateral movement of the cutter 27 for cutting across the film web 6 is along a groove 29 formed longitudinally in a cutter guide 28 that extends between the lower ends of the block members 11.

The front face of the cutter guide 28, that side facing the path of the continuous film web 6 from the supply roll 7, is also formed with vacuum holes 28', in a similar manner to the tacking means 17. Similarly, the vacuum holes 28' are connected to a vacuum source (not shown) and a vacuum supply control means (not shown) is provided in the vacuum line interconnected between the vacuum source and the vacuum holes 28' for selective vacuum supply to the particular rows of the vacuum holes 28' to accommodate a variety of film web widths. In this particular embodiment, the cutter 27 is operated by a motor (not shown in the cutter holder 26). However, it should be understood that the present invention encompasses a variety of known similar means which may be applied for the operation of the cutter 27 to the same effect. As an alternative means, for example, a piston-cylinder system may be employed in place of the pinion and rack arrangement so as to achieve the rotation and lateral movement of the cutter 27.

Figure 6:
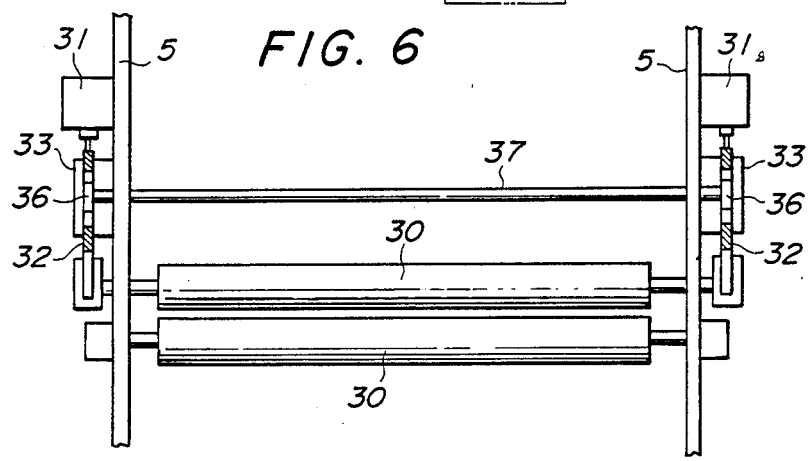
FIGS. 6 and 7 are respectively partial front and side views of a pressure roll assembly for use in the laminator of the first preferred embodiment.
Figure 7:
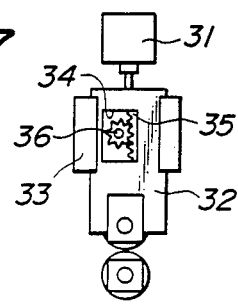
Figure 3:
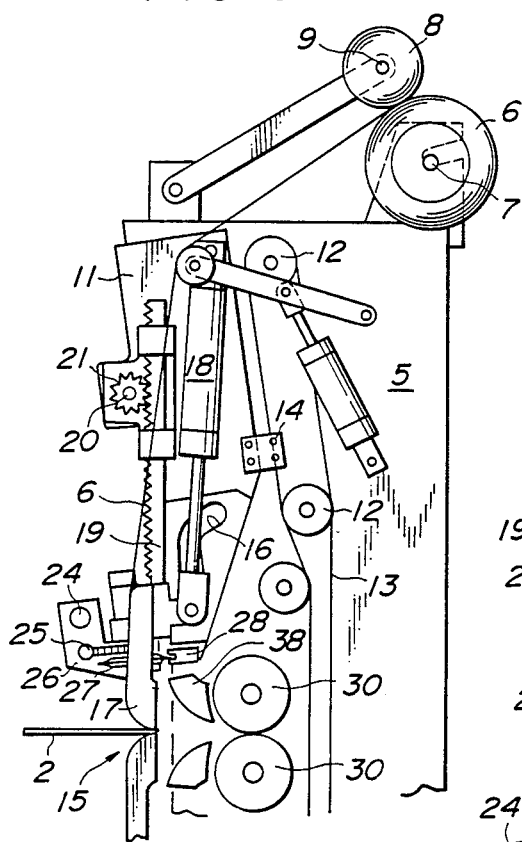
FIGS. 3 through 5 are schematic partial side views of the laminator of the first preferred embodiment, depicted to explain the function thereof.
Figure 4:
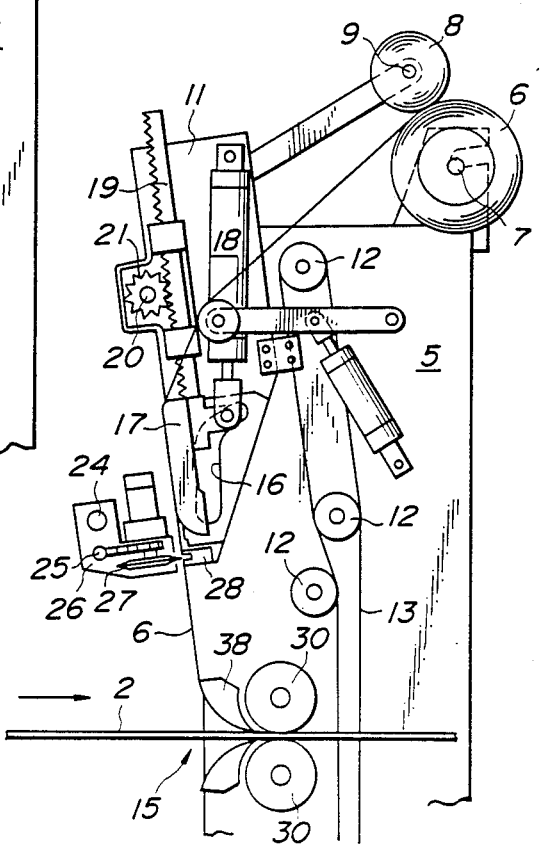
Figure 5:
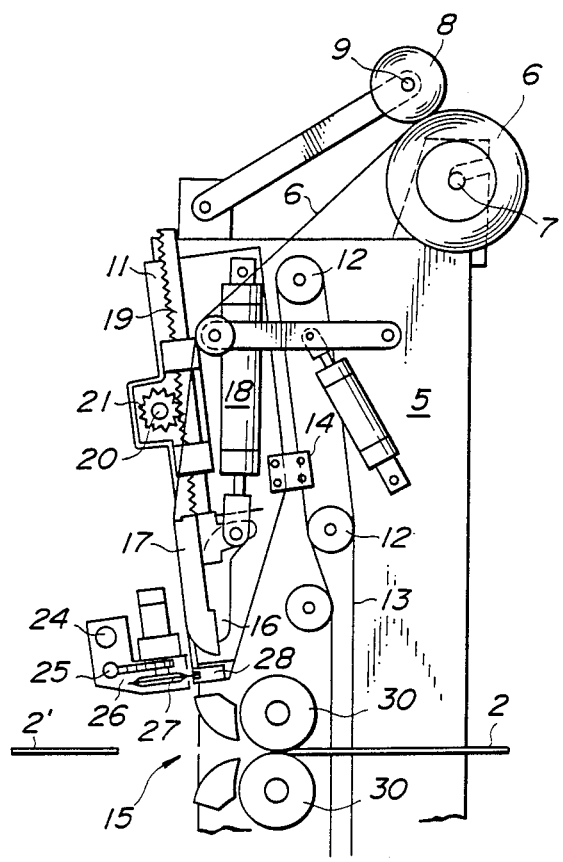

As best shown in FIGS. 3-5, a pair of pressure rolls 30, vertically arranged, are provided to extend between the support frames 5 with the gap between the rolls 30 aligned with the path of the blank panel 2. The rolls 30 are designed so as to compression stick the film 6 to the panel surface 2. Each support frame 5 is provided at its outre surface with a piston-cylinder system 31 which is in turn connected to a slide base 32, as shown in FIGS. 6 and 7. The lower end of each of the slide bases 32 supports at least one of the rolls 30, which is the upper roll in this particular embodiment. The slide bases 32 are moved up and down by the operation of the piston-cylinder systems 31 along guides 33 which are also secured to the respective support frames 5. This arrangement makes it possible to shift the position of the upper roll relative to the other of the pressure rolls 30 depending on the thickness of the panel 2 to be processed. Each of the slide bases 32 is provided with a opening 34 (FIG. 7 only). A vertical rack 35 is provided on one side of each opening 34. A pinion 36 is provided to engage in mesh with the rack 35. Between the support frames 5 extends a pinion shaft 37 that goes through the support frames 5 on either side for connection to the pinion 36. With this arrangement, when the position of the upper roll relative to the lower roll of the pressure rolls 30 is shifted, the movement of the upper roll is guided properly without tilting to produce a gap of uniform clearance sufficient to ensure the application of uniform pressure on the panel 2 by the rolls 30. As shown in FIG. 7, the pitch point defined by the rack 35 and the pinion 36 is positioned in the plane including the axes of the rolls 30. Therefore, the slide base 32 is prevented from tilting accidentally from its designed position.

Figure 2:
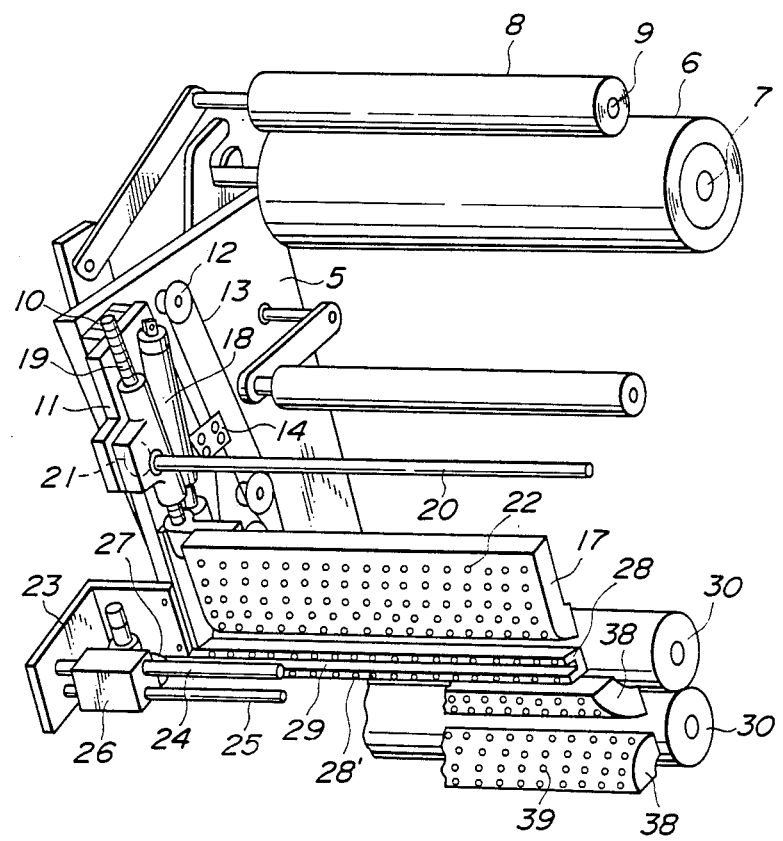
FIG. 2 is a perspective partial view illustrating the structure of the laminator of the first preferred embodiment.

In front of each of the pressure rolls 30 as shown in FIG. 2 are provided on the side of the tacking means 17 a pair of film guides 38 extending between the support frames 5. The front face of each of the film guides 38 is also provided with rows of vacuum holes 39, in a similar manner to the tacking means 17 and the cutter guide 28. Similarly, the vacuum holes 39 are connected to a vacuum source (not shown) with a vacuum supply control system (not shown) in the vacuum line interconnected between the vacuum holes 39 and the vacuum source for selective vacuum supply to the particular rows of the vacuum holes 39 so as to accommodate a variety of widths of film strip 6.

Operation of the laminator according to the present invention will be described in detail as follows with reference to FIG. 1.

The blank panel 2 to be processed is carried, after heating for enhancement for thermocompression sticking of the film thereto, on the entrance side conveyor assembly 3 to the laminator main body 1. The conveyor assembly 3 includes pairs of conveyor rollers 41a, 41b, 41c, 41d, 41e, 41f, and 41g aligned with the path of the panel 2 and a row of properly spaced sensors 40a, 40b, 40c, 40d, 40e, and 40f provided for detection of panels on the conveyor assembly 3 to produce a signal which in turn activates or stops operation of the particular roller pairs for the purpose of orderly feed of panels 2 to the tacking station 15. The sensor 40a, upon detection of the forward end of the panel 2, produces a signal to activate the roller pairs 41a through 41g which carry the panel 2 toward the tacking station 15. When the forward end of the panel 2 reaches the tacking station 15, the roller pairs 41a through 41g come to a stop. When there is no panel in position for detection by the sensor 40c while the sensors 40b and 40d through 40f each have a panel 2 in position for detection as shown in FIG. 1, the roller pairs 41a and 41b only, situated downstream of the sensor 40c, are stopped whereas the roller pairs 41c through 41g, situated upstream of the sensor 40c, are kept in operation. As a consequence, the panel 2 is kept immobile at the tacking station 15 while the panel 2' which follows the panel 2 is kept moving on the conveyor assembly 3. Next, the sensor 40c, upon sensing the forward end of the panel 2', produces a signal to stop the roller pairs 41c through 41g so that the panel 2' is prevented from bumping into the panel 2. In this manner, the selective operation and proper arrangement of the roller pairs 41 in conjunction with sensor 40 designed for detection of panels 2, make it possible to achieve the controlled feed of panels 2 to the laminator main body 1 at the shortest possible interval with resultant reduction in production time. This arrangement would also be effective particularly for cases where panels 2 to be processed vary in size.

When the panel 2 is carried over and stopped with its forward end positioning at the tacking station 15, the tacking means 17 is moved by the action of the piston-cylinder system 18 from its position shown in FIG. 5, with the continuous film web 6 attached to its guide surface by suction, toward the panel 2 and tacks the leading end of the film web 6 to the forward end of the panel 2, as shown in FIG. 3. At this moment of tacking, no vacuum has yet been created in the vacuum holes 28' and 39 of the cutter guide 28 and the film guides 38, respectively shown in FIG. 4.

After tacking as shown in FIG. 4, the tacking means 17 is moved back to the original retracted position. Simultaneously, the drive chains 13 are set in motion to move the block members 11 away from the tacking station 15 to the retracted position as shown in FIG. 4. Subsequently, the roller pairs 41a through 41g shown in FIG. 1 are activated to move the panel 2 into the gap between the pressure rolls 30 and the sticking operation is started by thermocompression of the film web 6 to the surface of the panel 2.

The sensor 40a, upon detection of the rearward end of the panel 2 as it is being advanced toward the pressure rolls 30, produces a signal to set the chains 13 in motion which in turn causes the block members 11 to move toward the tacking station 15 shown in FIGS. 3-5. During the block members 11 move, the cutter 27, while rotating, is set to move laterally from one side to the other to cut across the continuous film strip 6. It is so designed that the speed at which the block members 11 move from the retracted position toward the tacking station 15 is equated with the speed of transfer of the roller conveyor assembly 3 at the entrance side (or the circumferential velocity of the pressure rolls 30) and hence the speed of travel of the film web 6. Since the cutter 27 is mounted on the block members 11, the movement of the block members 11 toward the tacking station 15 causes the cutter 27 to move in the same direction and at the same speed as the film web 6, without any difference of relative velocity between them, such that the lateral movement of the cutter 27 produces a precise cut across the film web 6, thereby separating a rectangular film sheet to be stuck on the panel surface 2. Where the film web 6 is cut (or the length of the individual film sheet) is determined by the time at which the movement of the block member 11 toward the tacking station 15 is initiated. Accordingly, the film sheet of the just required length matching the size of the panel 2 will be obtained by controlling so that the block members 11 start movement toward the panel 2 at a given time after the sensor 40a detects the rearward end of the panel 2 on the conveyor assembly 3. The cutter 27 can complete its transverse slide to cut across the film web 6 during the tie of the movement of the block members 11 toward the tacking station 15, at any proper cutting speed.

While the film web 6 is being cut, the compression sticking of the film on the panel surface 2 by the pressure rolls 30 is continued without interruption. After the film sheet is separated from the film web 6, it is stuck completely to the panel 2. The tacking means 17 with the new leading end of the continuous film web 6 attached thereto is then held in the position as shown in FIG. 5 and is ready to operate on the next panel 2'. The same process is repeated on this panel 2.

Means should be incorporated to control precisely where the panel 2 is tacked with the film web 6 and where the film web 6 is cut across in relation to the feed of a panel 2 on the roller conveyor assembly 3. To this aim as shown in FIG. 1, a rotary encoder 42 may be employed which receives the signals from the sensors 40 provided on the roller conveyor assembly 3 on the entrance side of the laminator main body 1.

It is also required that the pressure rolls 30 rotate at a constant speed. In addition, the speed at which the block members 11 approach the tacking station 15 together with the cutter 27 to achieve cutting across the film web 6 should be matched with the circumferential velocity of the pressure rolls 30. In return movement of the block members 11 away from the tacking station 15, however, it is desirable from the viewpoint of operating efficiency to drive them at a greater speed regardless of the circumferential speed of the rolls 30.

Figure 8:
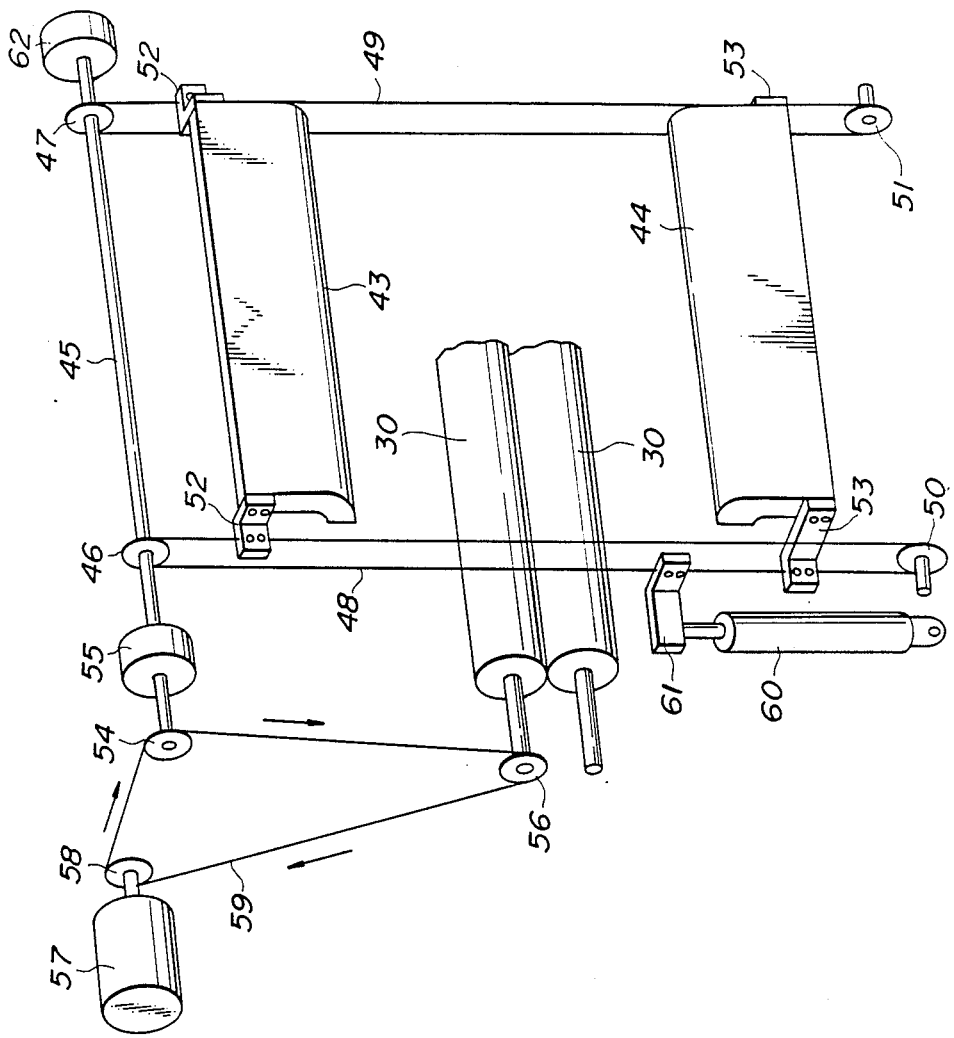
FIG. 8 is a partial perspective view of a laminator built in accordance with a second preferred embodiment of the present invention.

According to another second preferred embodiment of the present invention shown in FIG. 8, the laminator is built to a simple design that enables the block members 43 and 44 to move at two variable speeds, the speed matched with the circumferential speed of the pressure rolls 30 and a greater speed than that speed, without use or addition of a complex drive system.

The laminator of this embodiment further comprises a motor 57, a power transmission system operatively connected to the motor for rotating the paired pressure rolls 30 and for moving the block members 43 and 44 toward the tacking station at a speed which matches the circumferential velocity of the pressure rolls 30, a drive mechanism for causing the block members 43 and 44 to move away from the tacking station, and a clutch means 55 for releasably connecting the block members 43 and 44 to the power transmission system.

The block members 43 and 44 may be supported at either end on a pair of endless drive chains 48 and 49 that are respectively passed round a pair of sprockets 46 and 47 provided on a laterally extending rotary shaft at its opposite ends, and the power transmission system may be arranged to rotate the sprockets 46 and 47 so as to cause the block members 43 and 44 to move toward the tacking station.

The power transmission system may include an endless drive chain 59 passed round a drive shaft 58 of the motor 57, the rotary shaft 45, and a driven shaft 56 of one of the paired pressure rolls 30.

The drive system may include a piston-cylinder means 60.

The piston-cylinder means 60 may be secured at one end to the endless drive chains 48 and 49 on which the block members 43 and 44 are supported.

As an alternative means, any other suitable drive means may be used with or without direct connection to the block members 43 and 44.

FIG. 8 is a schematic diagram of this second embodiment, with the less important parts omitted for brevity's sake, in which the main parts are built to be substantially equal in overall structure and function to their counterparts in the previous embodiment shown in FIGS. 2 through 5, except for the drive system, the power transmission system, and the rotary shafts.

Referring now to FIG. 8, the laminator main body has a pair of block members 43 and 44 disposed vertically for movement toward and away from the middle of the laminator. Each of the block members 43 and 44 is supported at both ends on a pair of common endless drive chains 48 and 49 which are passed round a pair of sprockets 46 and 47 at the upper end of the laminator and another pair of sprockets 50 and 51 at the lower end of the laminator. The sprockets 46 and 47 are provided on opposite ends of a shaft 45 rotatably mounted on the laminator. The sprockets 50 and 51 may also be provided on a shaft rotatably mounted on the laminator or, as shown in FIG. 8, may be mounted on the laminator without a shaft. In this embodiment, the rotary shaft 45 and the lower sprockets 50 and 51 are mounted on the support frame (not shown) for free rotation. In FIG. 8, both of the block members 43 and 44 are depicted to resemble in shape a tacking means. However, this representation is aimed at simplifying the actual intricacies of the structure so that the operation of the system of this particular embodiment can be easily understood. It should be understood, therefore, that the block members 43 and 44 of this embodiment are in fact identical in configuration to their counterpart in the previous embodiment shown in FIGS. 2 through 5, each also carrying tacking means similar to the tacking means 11 identified in the same figures. As shown in FIG. 8, the upper block member 43 is supported through a connecting means 52 to the drive chains 48 and 49 on one side. On the other hand, the lower block member 44 is supported through connecting means 53 to the drive chains 48 and 49 on the other side. With this arrangement, operation of the drive chains 48 and 49 in one direction causes the block members 43 and 44 to move toward each other and in the opposite direction causes them to move away from each other.

The rotary shaft 45 carries another sprocket 54 on its extended leftmost end. A clutch 55 is mounted between the sprockets 54 and 46 on the shaft 45. The rotation of the sprocket 54 is selectively transmitted to the sprocket 46 by operation of the clutch 55.

The sprocket 54 is driven by a motor 57 through an endless drive chain 59 that is passed round the sprocket 54 and a sprocket 58 fixed on the shaft of the motor 57. The drive chain 59 is also passed round a sprocket 56 fixed on the shaft of one of the paired pressure rolls 30, so that the motor 57 can drive the rolls 30. The arrangement is such that, when the clutch 55 is in the engaged position, the motor 57 drives the rolls 30 and, at the same time, the rotary shaft 45 through the sprocket 54, causing the block members 43 and 44 to move toward each other through the sprocket 46. In this case, the speed of movement of each of the block members is matched with the circumferential velocity of the rolls 30 through a speed changer (not shown) which is mounted at a suitable location in the driving mechanism. On the other hand, if the clutch 55 is in the disconnected position, the motor 57 drives the rolls 30 alone.

A separate drive system operates the block members 43 and 44 in their movement away from each other. In this particular embodiment, as shown in FIG. 8, this drive system is a piston-cylinder system 60. The piston-cylinder system 60 is secured at its lower end to a fixed base and is connected at its upper end to the drive chain 48 through a connecting means 61. With this arrangement, operation of the piston-cylinder system 60, with the clutch 55 set in the released position, causes the block members 43 and 44 to move away from each other at a speed different from the circumferential velocity of the rolls 30.

The rotary shaft 45 may be provided on its rightmost end with a brake 62 for taking up the backlash.

Operation of the laminator according to this embodiment will now be described.

The clutch 55 is normally set in the released position. When the conveyor means 3 carries the panel 2 to be processed to the point where the panel 2 is placed stationarily with its forward end at the tacking station, the tacking means supported by each block member 43 and 44 which is positioned adjacent to the tacking station is caused to move toward the panel 2. Then, the tacking means tacks the forward end of the panel surface 2 with the leading end of the continuous film web 6. Upon the completion of the tacking operation by the tacking means, the tacking means are retracted and the piston-cylinder system 60 is actuated to move the block members 43 and 44 together with the tacking means away from the tacking station at a relatively greater speed than that at which they are moved to the tacking station. The panel 2 tacked with the film web 6 is then moved on the conveyor means 3 and the film 6 is started to be stuck on the panel surface 2 between the pressure rolls 30 which are rotated at a constant circumferential velocity by the motor 57.

A signal for initiation of the film web cutting operation causes the piston-cylinder system 60 to shift to the non-actuation position. At this moment, the clutch 55 is actuated to engage the sprocket 54 to the sprocket 46, causing the block members 43 and 44 to start moving toward the tacking station at a speed matched with the circumferential velocity of the rolls 30. During this movement of the block members 43 and 44, the cutter 27 performs transverse movement to cut across the film web 6, separating an individual film sheet 6 of predetermined length matching the size of the panel 2. When the block members 43 and 44 in their movement towards the tacking station reach a preset point, after the film sheet 6 has been severed off, the clutch 55 is released and the block members 43, 44 cease to move. The pressure rolls 30 still continue to rotate so as to stick the remaining part of the film sheet 6 on the panel surface 2 to complete the laminated panel. When the next panel 2 to be processed reaches the tacking station, the same process is repeated, starting with the tacking operation.

It will be easily appreciated from the above description that, according to the method of the present invention, the individual film sheet 6 to be compression stuck on the panel surface 2 is cut to just the required length from the continuous film web 6 and, in addition, this cutting is effected while the film 6 is stuck on the panel surface 2, so that the additional finishing operations as well as wastage of film 6 can be eliminated. In addition, the compression sticking of film 6 on the panel surface 2 is effected with a continuous sweep of operation, without the pressure rolls 30 temporarily stopping rotation midway on the panel 2 during the sticking operation, thus producing a uniform surface condition on the film sheet 6. These features will contribute to production of high quality film sheet laminated panels.

The cutter 27 used for cutting film web 6 in this invention may be any known cutting tool, although a circular cutting blade is mentioned in the above description. Likewise, the piston-cylinder system and the drive chain and sprocket system may respectively be replaced by suitable known drive means. Where the film 6 is required to be stuck on both sides of a panel 2, the laminator of the present invention is designed such that the components of the laminator are provided substantially in symmetry with respect to the conveyor means 3 for feeding panels 2. However, where the compression sticking of film 6 is made on one side of a panel 2, the laminator can be built with a single unit of lamination means.

Moreover, the laminator main body 1 may be mounted on a slidable base on rails so that it can be bodily pulled out from a work position to one side. This construction would be convenient when the laminator is required for maintenance or repair.

The tacking means 17, the cutter guide 28 and the film guide 38 respectively, may have their vacuum holes 22, 28 and 39 connected to a separate vacuum source or, more preferably, to a common vacuum source (such as a vacuum pump). On them, the vacuum holes are arranged in columns, the center column disposed to correspond to the longitudinal centerline of the continuous film web 6 and the other columns are distributed over the width of the film web 6, with every one or more columns of vacuum holes being connected through a separate branch vacuum line to the vacuum source. Each of the branch vacuum lines is provided with a separate control valve provided between the vacuum holes and the source. All of the branch vacuum lines respectively of the tacking means 17, the cutter guide 28 and the film guide 38 are made to converge to a separate main vacuum line which is also provided with a control valve. These control valves are individually operated to create a vacuum. When the tacking means 17 are in operation for tacking, the control valves in the main vacuum lines connected to the film guide 38 and the cutter guide 28 are kept closed so that a vacuum is created in the vacuum holes 22 of the tacking means 17 alone. The main vacuum lines may be connected to the common vacuum source through a common primary vacuum line.

What is claimed is:

1. A method of sticking a film sheet, cut from a continuous film web having a leading end, onto the surface of a panel having a forward end and a rearward end, comprising the steps of:

tacking the leading end of the continuous film web to the forward end of the panel;

sticking the continuous film web onto the surface of the panel in a continuous operation from the forward end to the rearward end of the panel while supplying the continuous film web along a predetermined path to the panel in a given direction and at a given speed; and cutting across the continuous film web during the continuous operation to cut the continuous film web into a film sheet and to provide a trailing end of the film sheet that will coincide with the rearward end of the panel without any interruption in said continuous operation by moving a cutter across the continuous film web while moving the cutter in the same given direction and at the same given speed as is the continuous film web when supplied to the panel along the predetermined path.

* * * * *

(12) REEXAMINATION CERTIFICATE (4636th)
United States Patent
Miyake

(10) Number: US 4,743,325 C1
(45) Certificate Issued: Sep. 10, 2002

(54) METHOD OF STICKING FILM SHEET ON PANEL SURFACE

(75) Inventor: Eiichi Miyake, Osaka (JP)

(73) Assignees: Hakuto Co., Ltd., Tokyo; Sanei Gikens Co., Ltd., Osaka, both of (JP)

Reexamination Request:
No. 90/005,919, Jan. 30, 2001

Reexamination Certificate for:
Patent No.: 4,743,325
Issued: May 10, 1988
Appl. No.: 06/908,233
Filed: Sep. 17, 1986

Related U.S. Application Data

(62) Division of application No. 06/607,114, filed on May 1, 1984, now Pat. No. 4,659,419.

(30) Foreign Application Priority Data

May 11, 1983 (JP) .............................................. 58-82241
Oct. 3, 1983 (JP) ........................................... 58-184659

(51) Int. Cl.⁷ ........................ B32B 31/18; B32B 31/20; B26D 1/60
(52) U.S. Cl. ...................... 156/250; 156/522; 156/362; 156/355; 156/510; 156/521; 156/552; 156/555; 83/56
(58) Field of Search .............................. 156/522, 362, 156/355; 83/56

(56) References Cited

U.S. PATENT DOCUMENTS

| | | | |
|---|---|---|---|
| 1,062,814 A | 5/1913 | Bernhardt | 83/56 |
| 1,118,460 A | 11/1914 | Winkley | 83/314 |
| 2,721,669 A | 10/1955 | Keely | 156/351 |
| 2,894,559 A | 7/1959 | Eccher | 156/352 |
| 4,025,380 A * | 5/1977 | Bernardo | 156/355 |
| 4,038,128 A * | 7/1977 | Mueller | 156/355 |

* cited by examiner

*Primary Examiner*—Linda L. Gray

(57) ABSTRACT

A method of sticking film sheet on a panel surface is disclosed in which a continuous web of film is cut to proper length fitted to the size of the panel to make an individual film sheet during continuous sticking operation for producing a film laminated panel. The sticking operation is not interrupted by the cutting operation.

A laminator constructed to achieve this film laminated panel manufacture includes block members which are movable toward and away from the tacking station where the leading end of the continuous web of film is tacked to the forward end of the panel, and a cutter mounted on the block members. The cutter severs across the film web as the block members moves toward the tacking station in the same direction and at the same speed as the film web during sticking operation.

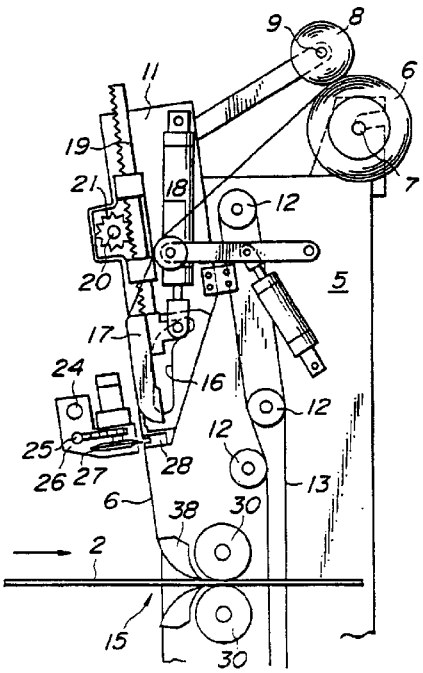

US 4,743,325 C1

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 1 is cancelled.

New claims 2–6 are added and determined to be patentable.

*2. A method of sticking a film sheet, cut from a continuous film web having a leading end, onto a surface of a panel having a forward end and a rearward end, by using a cutter and an elongated member operable as a cutter guide for cooperating with the cutter, the elongated member extending transversely to the continuous film web and having vacuum holes shaped to face the continuous film web, said method comprising:*

*tacking the leading end of the continuous film web to the forward end of the panel;*

*sticking the continuous film web onto the surface of the panel in a continuous operation from the forward end of the panel to the rearward end of the panel while supplying the continuous film web along a predetermined path to the panel in a given direction and at a given speed; and*

*cutting across the continuous film web during the continuous operation to cut the continuous film web into a film sheet and to provide a trailing end of the film sheet that coincides with the rearward end of the panel without any interruption in the continuous operation by moving the cutter across the continuous film web while also moving the cutter and the elongated member in the given direction and at the given speed of the continuous film web when supplied to the panel along the predetermined path.*

*3. A method according to claim 2, wherein the elongated member has a longitudinal groove shaped to face the continuous film web along which the cutter laterally moves to cut across the continuous film web.*

*4. A method of sticking a film sheet, cut from a continuous film web having a leading end, onto a surface of a panel having a forward end and a rearward end, by using a tacking means, a cutter, and an elongated member for cooperating with the cutter, the tacking means extending transversely to the continuous film web and having vacuum holes shaped to face the continuous film web, and the elongated member extending transversely to the continuous film web and having vacuum holes shaped to face the continuous film web, said method comprising:*

*tacking the leading end of the continuous film web attached by suction to a film guide surface of said tacking means to the forward end of the panel;*

*sticking the continuous film web onto the surface of the panel in a continuous operation from the forward end of the panel to the rearward end of the panel while supplying the continuous film web along a predetermined path to the panel in a given direction and at a given speed; and*

*cutting across the continuous film web during the continuous operation to cut the continuous film web into a film sheet and to provide a trailing end of the film sheet that coincides with the rearward end of the panel without any interruption in the continuous operation by moving the cutter across the continuous film web while also moving the cutter, the elongated member, and the tacking means in the given direction and at the given speed of the continuous film web when supplied to the panel along the predetermined path.*

*5. A method of sticking a film sheet, cut from a continuous film web having a leading end, onto a surface of a panel having a forward end and a rearward end, by using a cutter, a pair of block members, and a pair of pressure rollers, the pair of block members extending transversely to the continuous film web, said method comprising:*

*tacking the leading end of the continuous film web to the forward end of the panel;*

*sticking the continuous film web onto the surface of the panel in a continuous operation from the forward end of the panel to the rearward end of the panel between the pair of pressure rollers while supplying the continuous film web along a predetermined path to the panel in a given direction and at a given speed; and*

*cutting across the continuous film web during the continuous operation to cut the continuous film web into a film sheet and to provide a trailing end of the film sheet that coincides with the rearward end of the panel without any interruption in the continuous operation by moving the cutter across the continuous film web while also moving the cutter in the given direction and at the given speed of the continuous film web when supplied to the panel along the predetermined path,*

*wherein the pair of block members are moveable towards each other at a speed matched by a circumferential velocity of the pair of pressure rollers.*

*6. A method according to claim 5, wherein a single motor drives the pair of block members and the pair of pressure rollers.*

\* \* \* \* \*